United States Patent [19]

Cavasin

[11] Patent Number: 5,302,849
[45] Date of Patent: Apr. 12, 1994

[54] PLASTIC LAND GRID ARRAY SEMICONDUCTOR DEVICE AND METHOD FOR MAKING THE SAME

[75] Inventor: Daniel Cavasin, Austin, Tex.

[73] Assignee: Motorola, Inc., Schaumburg, Ill.

[21] Appl. No.: 24,060

[22] Filed: Mar. 1, 1993

[51] Int. Cl.[5] ............... H01L 23/48; H01L 29/46; H01L 29/62; H01L 29/64
[52] U.S. Cl. ............... 257/666; 257/676; 257/787; 257/697; 257/696
[58] Field of Search ............ 257/676, 666, 787, 696, 257/697

[56] References Cited

U.S. PATENT DOCUMENTS

| 3,566,208 | 2/1971 | Wang | 257/790 |
| 5,089,876 | 2/1992 | Ishioka | 357/70 |
| 5,139,969 | 8/1992 | Mori | 437/183 |
| 5,164,815 | 11/1992 | Lim | 257/666 |

FOREIGN PATENT DOCUMENTS

| 54-128278 | 10/1979 | Japan | 257/666 |
| 3-171655 | 7/1991 | Japan | 257/666 |

Primary Examiner—Rolf Hille
Assistant Examiner—S. V. Clark
Attorney, Agent, or Firm—Minh-Hien N. Clark

[57] ABSTRACT

A plastic land grid array semiconductor device (30) can be manufactured using conventional techniques. In one embodiment, a semiconductor die (12) having an active surface is provided. An LOC leadframe (14) is provided, wherein leads (16) have a horizontal portion (18) and a vertical portion (20). The active surface of the die is attached to the leads with an LOC tape (17) and is electrically connected to the horizontal portion by wire bonds (24). A plastic package body (32) is molded around the die, the wire bonds, and a portion of the leadframe. The vertical portion of the leads terminates and its thickness is exposed at a surface of the package body, thus forming a grid array of external electrical contacts. An insulative material (34) is coated on the sides of the package body to cover any exposed thickness of the horizontal portion of the leads.

15 Claims, 2 Drawing Sheets

PLASTIC LAND GRID ARRAY SEMICONDUCTOR DEVICE AND METHOD FOR MAKING THE SAME

CROSS-REFERENCE TO RELATED APPLICATION

Related subject matter is disclosed in U.S. patent application Ser. No. 07/909,483 by Ziep Tran et al., entitled "Bumped Leadless Semiconductor Device and Method for Its Fabrication," filed Jul. 6, 1992 and assigned to the assignee hereof.

FIELD OF THE INVENTION

This invention relates to a semiconductor device in general, and more specifically to a plastic encapsulated semiconductor device having a land grid array of electrical contacts and a method for making the same.

BACKGROUND OF THE INVENTION

Semiconductor devices are widely used in various types of electronic products, portable consumer products, automobiles, integrated circuit cards, and the like. One feature of semiconductor devices which is important in many of these applications is the size of a semiconductor device, which includes both the semiconductor die and the package in which it is housed. In particular, it is desirable to keep the footprint or X-Y dimensions of the device small in addition to minimizing its thickness. Conventional plastic semiconductor devices typically have peripheral outer leads for electrical connections to a board. These outer leads generally protrude from the sides of the package body of a device and are formed into different shapes, such as gull-wing or J-lead, to facilitate placement and soldering operations. The presence of these outer leads on devices means that more board space is occupied by each device. Additionally, the outer leads are susceptible to bending and skewing during handling in assembly and test. Lead damage can render a device unacceptable for board mounting. Yet, many of the plastic semiconductor devices are fine-pitched which causes the devices to be more prone to lead damage during handling.

The development of overmolded pad array carrier semiconductor devices has provided some advantages over conventional leaded packages. These overmolded devices allow greater input/output (I/O) densities without undue size increases. Additionally, the overmolded devices are surface mount packages which are desirable in today's applications. However, the overmolded pad array carrier is susceptible to moisture which causes the device to be crack prone unless it is dry-packed. One reason why the overmolded pad array carrier is not as reliable as conventional plastic devices under moderate to severe environmental conditions is that the construction of the overmolded pad array carrier utilizes materials with very dissimilar thermal expansion coefficients. Therefore, the overmolded pad array carrier semiconductor device has a tendency to warp and delaminate during the solder reflow operation associated with board mounting if the device has been exposed to moisture.

However, because of the small size of the overmolded pad array carrier semiconductor device, this type of package is becoming increasingly popular. Yet, the overmolded device has limited thermal dissipation. However, as devices become faster, higher thermal dissipation in a package configuration becomes necessary.

It is desirable to have a plastic semiconductor device which has a small package outline, is thin, is reliable under moderate moisture conditions, and is thermally efficient.

SUMMARY OF THE INVENTION

This invention provides a plastic land grid array semiconductor device and a method for making the same. In one embodiment, a semiconductor die having an active surface is provided. A leadframe having a plurality of leads is also provided. The plurality of leads has a horizontal portion and a vertical portion, wherein both portions have a thickness. The horizontal portion extends over the active surface of the semiconductor die and is electrically connected to the active surface. A plastic package body is molded to cover at least the active surface of the semiconductor die and a portion of the plurality of leads, wherein the vertical portion of the plurality of leads terminates at a surface of the plastic package body. An insulating material is coated onto a portion of the plastic package body to cover any exposed thickness of the horizontal portion of the plurality of leads. The thickness of the vertical portion of the plurality of leads is exposed on the surface of the plastic package body to form a grid array of external electrical contacts. The invention also provides a structure produced by the same method.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
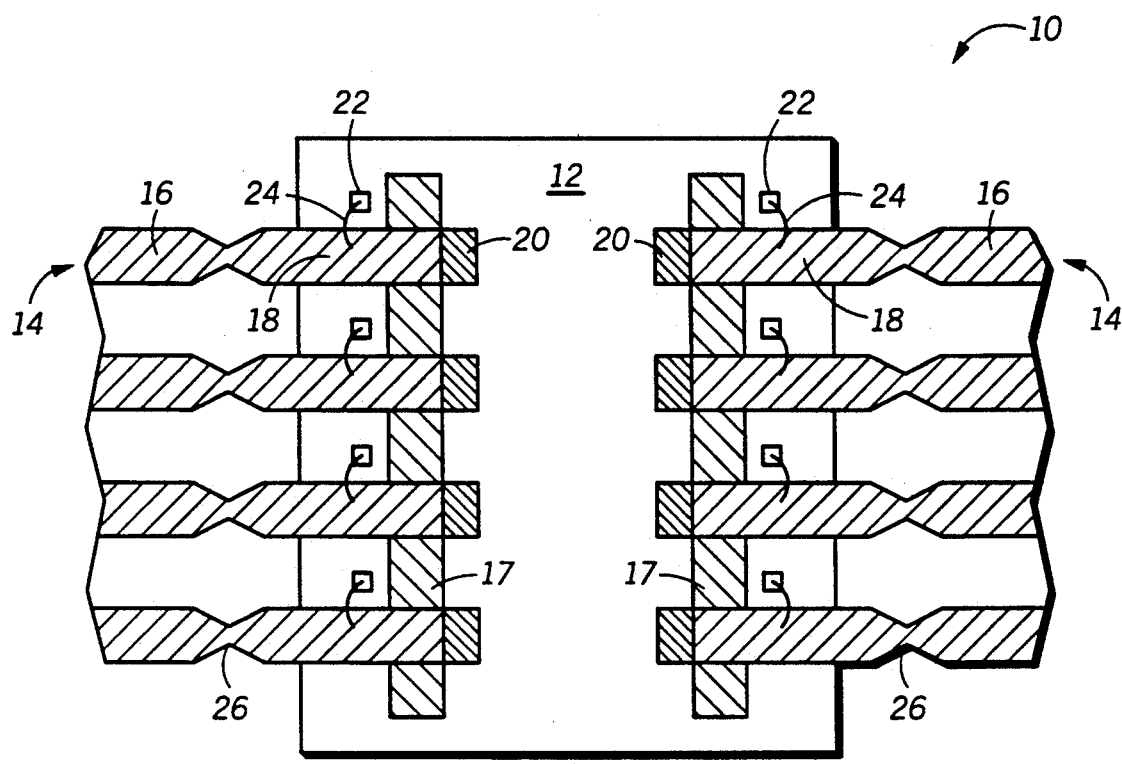
FIG. 1 illustrates, in a top view, a leadframe electrically connected to a semiconductor die in accordance with the invention.

The invention is now discussed in detail with reference to the figures. FIG. 1 illustrates, in a top view, a leadframe assembly 10 in accordance with the invention. Leadframe assembly 10 illustrates a semiconductor die 12 that is connected to a leadframe 14. Leadframe 14 is only partially depicted for ease of illustration and for clarity of the relevant elements necessary to practice the invention. Leadframe 14 has a plurality of leads 16 that extend on two sides over an active surface of the semiconductor die 12. It should be noted that a quad leadframe, or one having leads extending on four sides (not illustrated), is also applicable in this invention. The specific lead layout of leadframe 14 is dependent on the semiconductor die 12. A tape 17 is used to physically attach the leads 16 of the leadframe 14 to the active surface of the die 12. Tape 17 is usually a thermosetting or thermoplastic polyimide tape. However, any tape used in conventional lead-on-chip applications can be used to practice the invention. Moreover, the configuration of the tape 17 can differ significantly from what is illustrated in FIG. 1. For example, discrete pieces of tape can be applied to each individual lead, or a single piece of tape can be used to attach all of the leads.

As illustrated in FIG. 1, the leads 16 have two portions: a horizontal portion 18 and a vertical portion 20. The horizontal portion 18 of the plurality of leads 16 is electrically connected to bonding pads 22 on the active surface of the semiconductor die 12 by a plurality of wire bonds 24. The wire bonds 24 can be made to any practical location on the horizontal portion 18 of the leads 16. Methods of wire bonding are well known in the art. The vertical portion 20 is formed by a mechanical forming technique. The leads 16 are bent along a set of forming axes along the length of the leads 16 to form the vertical portion 20. The location of the forming axes is dependent on the location of bonding pads on the surface of the die and the desired external contact location. It is important to note that the lead forming operation to form the vertical portion 20 of the leads 16 should be performed before the horizontal portion 18 of the leads 16 is attached to the active surface of the die 12.

In FIG. 1, semiconductor die 12 is illustrated to have bonding pads 22 along two edges of the die, which is typical of a memory device. However, microprocessors, digital signal processors, and other devices tend to have bonding pads along all four edges of the die, or the bonding pads can be in an area array format covering the surface of the die. It is possible to extend the invention to a quad or area array configuration. The geometry of the lead layout can be designed to accommodate the different locations of the bonding pads.

Also illustrated in FIG. 1 is a plurality of notches 26 in the leads 16. These notches 26 facilitate the trimming of the leads 16 at the end of the assembly process. The usefulness of these notches will become more apparent in subsequent discussion of embodiments of the invention. It should be noted, however, that in addition to notches, grooves or any type of necking in the leads 16 can help to facilitate the trimming of the leads at the end of the assembly process.

Figure 2:
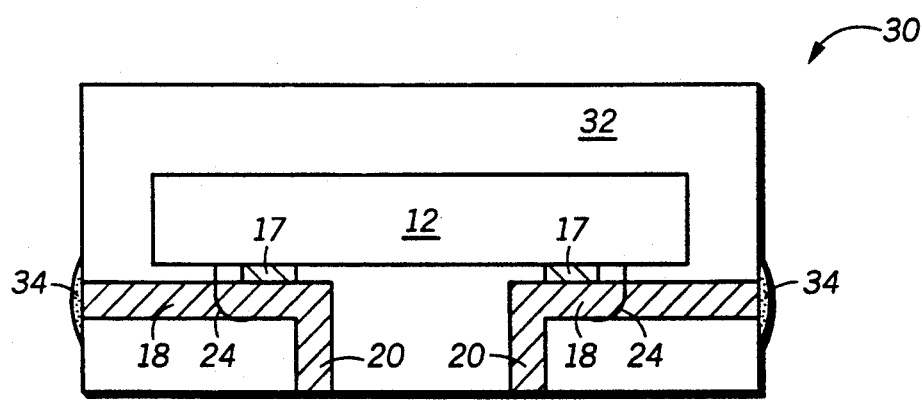
FIG. 2 illustrates, in cross-section, a plastic land grid array semiconductor device in a first embodiment of the invention.

FIG. 2 illustrates, in a cross-sectional view, a plastic land grid array semiconductor device 30 in a first embodiment of the invention. Device 30 utilizes the leadframe assembly of FIG. 1. A plastic package body 32 is formed around the semiconductor die 12, the plurality of wire bonds 24, and a portion of the plurality of leads 16. Plastic package body 32 is typically formed from a resin encapsulant that is molded under elevated temperature and pressure using conventional transfer molding equipment. The two most popular classes of resin encapsulants are epoxy novolac resins and silicone resins, although other materials may also be possible to use for the package body 32. Although not specifically illustrated, it is often desirable to have the sidewalls of the package body 32 be tapered with a draft angle. Tapered sidewalls are not required to practice the invention but they do aid in the release of the package body 32 from the mold tool. Typical draft angles range from approximately 3° to 7°. It is also possible that the package body can be formed to expose the inactive surface of the semiconductor die. Since silicon is a good conductor, having the inactive surface exposed will increase the heat dissipation of the device during operation. Furthermore, a heat sink (not illustrated) can be attached to the inactive surface of the device for even more efficient heat dissipation.

The horizontal portion 18 of the leads 16 is encapsulated by the plastic package body 32, while the vertical portion 20 of the leads 16 terminates at a surface of the package body 32. The height of the vertical portion 20 is approximately 10 mils (0.254 millimeter) for a typical 1 millimeter thick package. However, this height can vary depending on the thickness of the plastic package body. The thickness of the leads, typically 5 to 8 mils (0.127 to 0.203 millimeter) forms a grid array of external electrical contacts, also known as a land grid array. It is possible during molding that the thickness of the plastic body may be greater than the height of the vertical portion 20, or there may be some resin bleed or flash covering the thickness of the vertical portion 20. In that instance, a slurry deflash operation may be performed to remove the excess plastic in order to expose the thickness of the vertical portion of the leads. An alternative method is to perform a grinding or planarizing operation on that surface of the package body to remove the excess plastic. The device 30 can be attached to a board by either solder bumping the grid array of external electrical contacts formed by the thickness of the vertical portion 20 of the leads 16 and then reflowing the solder bumps to a board. An alternative method is to bump the board and then reflowing the bumps to the land grid array on the package body surface.

Also illustrated in FIG. 2 is an insulative coating 34, such as a nonconductive epoxy, on the edges of the plastic package body 32. The purpose of insulative coating 34 is to electrically insulate the edges of the package body 32 where the leads 16 have been trimmed away from the package body. Keeping in mind that most assembly processes are performed on a leadframe strip which accommodates a multiplicity of semiconductor dice, it is necessary to trim the leadframe away from the package body after molding in order to singulate the devices into individual units. A conventional leaded package generally has external leads protruding from the sides of the package body, where the leads are formed into different shapes, such as gull-wing or J-lead, to facilitate placement and soldering operations. This embodiment of the present invention does not require external side leads which saves board space upon mounting of the device. Since no external leads are required, the leadframe can be trimmed away at the edge of the package body 32. The presence of the notches 26, as illustrated in FIG. 1, facilitates the trimming of the excess leadframe because the notches represent the weakest points on the leadframe. Therefore, it is preferable to design location of the notches 26 on the leads 16 to correspond to the package body outline where it is desirable to trim away the external leads.

An advantage to this embodiment of the present invention is that no plating operation of the leadframe is necessary. Conventional leaded packages generally require a plating of the leads to improve solderability of the leads. By eliminating external leads in this invention, the plating operation is removed. Another advantage to this embodiment is that the external electrical contacts are on a surface of the package body of the device which reduces the footprint or X-Y dimensions of the device which is desirable for maximizing board density. Moreover, this embodiment of the invention utilizes conventional packaging technology and materials which means that no new tooling need be developed. The only new tool required is the mechanical lead forming punch to form the vertical portion of the leads. It has also been shown that in other package designs where the thickness of the package body is approximately 1 millimeter that the packaged device is more robust in terms of cracking and delamination than an overmolded pad array carrier. Yet another advantage to this embodiment of the invention is that the inactive surface of the semiconductor die can be exposed for good heat dissipation. A heat sink may also be optionally attached to the inactive surface for increased thermal management of the device depending on the power generated by the device during operation.

The remaining figures which illustrate further embodiments of the present invention incorporate many of the same or similar elements as those described above in reference to device 30. Therefore, like reference numerals designate identical or corresponding parts throughout the several views which follow.

Figure 3:
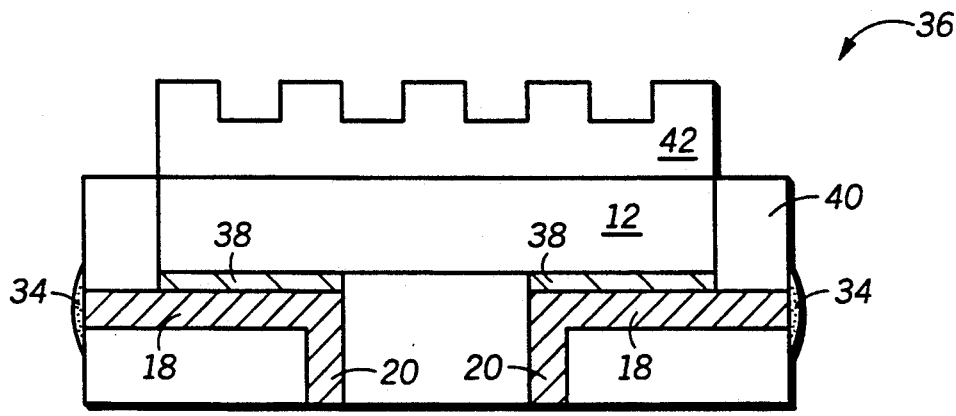
FIG. 3 illustrates, in cross-section, a plastic land grid array semiconductor device in a second embodiment of the invention.

FIG. 3 illustrates, in a cross-sectional view, a plastic land grid array semiconductor device 36 in a second embodiment of the present invention. In this embodiment, semiconductor die 12 is electrically connected to the horizontal portion 18 of the leads 16 by an anisotropic conductive adhesive 38. Anisotropic conductive adhesive 38 is a commercially available product that conducts only in the z-axis, or vertical direction. Therefore, no shorting occurs between the individual leads 16. It is important to realize, however, that in this embodiment, the leads 16 must be aligned directly over the bonding pads of the semiconductor die 12 to establish electrical connections between the bonding pads and the horizontal portion 18 of the leads 16. Anisotropic conductive adhesive 38 can be applied in a film or paste form. An advantage of using an anisotropic adhesive to form the electrical connections is that an extra wire bonding step may be eliminated. Furthermore, for devices having an area array of bonding pads, the routing geometry of the leads may be simplified if consideration for wire bonding is not necessary.

In FIG. 3, a plastic package body 40 covers the active surface of the semiconductor die 12 but does not encapsulate the inactive surface. The device can optionally be mounted to a board with the inactive surface exposed. Since silicon is a good conductor, exposing the inactive surface of the die 12 to the environment will increase the heat dissipation of the device. It is preferable to mount devices to a board where heat being generated by the device will dissipate into the air and not the board. Additionally illustrated in FIG. 3 is a heat sink 42 attached to the inactive surface of the semiconductor die 12. Having heat sink 42 increased the heat dissipating capacity of the device. Some high powered devices may require a package design having a low thermal resistance. An improvement in the thermal resistance of the packaged device is possible with the addition of heat sink 42.

Figure 4:
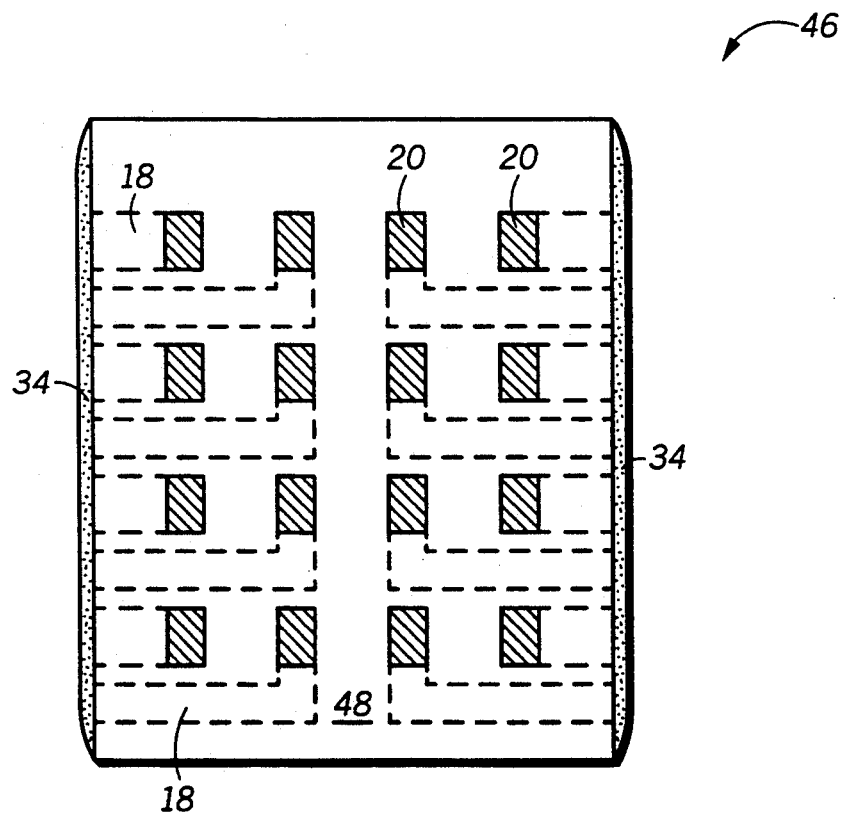
FIG. 4 illustrates, in a top view, a plastic land grid array semiconductor device in a third embodiment of the invention.

Illustrated in FIG. 4 is a top view of a plastic land grid array semiconductor device 46 in a third embodiment of the invention. FIG. 4 is intended to illustrate a device wherein the thickness of the vertical portion 20 of the forms an area array of external electrical contacts, as opposed to the peripheral array illustrated in FIG. 1. An example of how the leads may be routed internally to the device can be seen by the dashed line representing the horizontal portion 18 of the leads. Again, the lead layout may vary significantly depending on the number and location of bonding pads on the active surface of a semiconductor die. Package body 48 is formed in the same conventional transfer molding process. Although not shown in this view, the electrical connections between the active surface of the semiconductor die and the horizontal portion of the lead are preferably formed with an anisotropic conductive adhesive. However, conventional wire bonding may also be used if practicable.

The second and third embodiments of the present invention share the same advantages previously set forth for the first embodiment. Plating is eliminated; the device footprint is minimized; the package profile is thin; and the device is thermally efficient with an optionally added heat sink.

The foregoing description and illustrations contained herein demonstrate many of the advantages associated with the present invention. In particular, it has been revealed that a manufacturing process which utilizes conventional techniques and equipment can be used to fabricate a plastic land grid array semiconductor device. Furthermore, the semiconductor device can be manufactured with an exposed inactive silicon surface for improved thermal dissipation in addition to the option of attaching a heat sink to the exposed surface. Embodiments of the invention do not have external peripheral leads which protrude from the sides of a package body, but rather a land grid array of external electrical contacts on a surface of the package body, thus minimizing the device footprint. Additionally, since there are no external leads, a plating process normally associated with lead plating to improve solderability can be eliminated which translates into a faster assembly cycle time as well as a cost savings. The plastic land grid array semiconductor device also has the same reliability in terms of package cracking and delamination due to moisture vaporizing in the package body as a thin small outline package (TSOP), which has been shown to be more robust than an overmolded pad array carrier.

Thus it is apparent that there has been provided, in accordance with the invention, a plastic land grid array semiconductor device and a method for its fabrication which overcomes the problems associated with the prior art devices. Although the invention has been described and illustrated with reference to specific embodiments thereof, it is not intended that the invention be limited to these illustrative embodiments. Those skilled in the art will recognize that variations and modifications can be made without departing from the spirit of the invention. For example, the placement and geometry of the leads on the leadframe is not restricted by the present invention. The lead layout is dependent upon the types and configurations of the various semiconductor die used in a device. Furthermore, the invention is not limited to any specific leadframe thickness. In addition, the present invention is not limited to any specific number or kind of semiconductor die used. Any type of semiconductor die, such as a memory or a microprocessor, can be packaged in an embodiment of the invention. Furthermore, the package body may either fully encapsulate the semiconductor die or expose the inactive surface of the die in any of the embodiments. The package body may also have tapered sidewalls. Additionally, a heat sink may be attached to the inactive surface of the semiconductor die in any of the embodiments provided that the inactive surface is at least partially exposed. Moreover, materials and methods other than those described for electrically connecting the semiconductor die to the leadframe and for molding the devices are possible. Furthermore, the invention is not limited to silicon semiconductor devices but is also applicable to any other type of semiconductors such as gallium arsenide. Also, other methods of attaching the device to a board besides solder bumping are anticipated as being suitable in practicing the invention, such as solder columns and conductive polymer balls. Thus it is intended to encompass within the invention all such variations and modifications falling within the scope of the appended claims.

I claim:

1. A plastic land grid array semiconductor device comprising:
    a leadframe having a plurality of L-shaped leads, the plurality of L-shaped leads having a horizontal portion and a vertical portion, both portions having a thickness;
    a semiconductor die having a plurality of pads on an active surface which is electrically connected to the horizontal portion of the plurality of L-shaped leads, wherein the horizontal portion originates in proximity to an edge of the semiconductor die, extends over the active surface toward the plurality of pads, and terminates with the vertical portion angling away from the semiconductor die;
    a plastic package body covering at least the active surface of the semiconductor die and a portion of the plurality of leads, wherein the vertical portion of the plurality of leads terminates at a surface of the plastic package body, said surface being substantially parallel to the active surface of the semiconductor die; and
    an insulative coating on an external side portion of the plastic package body to cover any exposed thickness of the horizontal portion of the plurality of leads;
wherein the thickness of the vertical portion of the plurality of leads is exposed on the surface of the plastic package body to form a grid array of external electrical contacts.

2. The device of claim 1, wherein the plurality of pads on the active surface of the semiconductor die is electrically connected to the horizontal portion of the plurality of leads by a plurality of wire bonds.

3. The device of claim 1, wherein the grid array of external electrical contacts is a peripheral array.

4. The device of claim 1, wherein the plurality of pads on the active surface of the semiconductor die is electrically connected to the horizontal portion of the plurality of leads by an anisotropic conductive adhesive.

5. The device of claim 4, wherein the grid array of external electrical contacts is an area array.

6. The semiconductor device of claim 1, wherein the plastic package body comprises an resin encapsulant.

7. A plastic land grid array semiconductor device comprising:
    a semiconductor die having a plurality of bonding pads on an active surface;
    a leadframe having a plurality of L-shaped leads, the plurality of L-shaped leads having a horizontal portion and a vertical portion, both portions having a thickness, wherein the horizontal portion originates in proximity to an edge of the semiconductor die, extends over the active surface toward the plurality of bonding pads, and terminates with the vertical portion angling away from the active surface of the semiconductor die;
    a plurality of wire bonds connecting the active surface of the semiconductor die to the horizontal portion of the plurality of L-shaped leads;
    a plastic package body covering at least the active surface of the semiconductor die, the plurality of wire bonds, and a portion of the plurality of leads, wherein the vertical portion of the plurality of leads terminates at a surface of the plastic package body, said surface being substantially parallel to the active surface of the semiconductor die; and
    an insulative coating on an external side portion of the plastic package body to cover any exposed thickness of the horizontal portion of the plurality of leads;
wherein the thickness of the vertical portion of the plurality of leads is exposed on the surface of the plastic package body to form a grid array of external electrical contacts.

8. The semiconductor device of claim 7, wherein the vertical portion of the plurality of leads is angled away from the semiconductor die at substantially 90 degrees from the active surface of the semiconductor die.

9. The semiconductor device of claim 7, wherein a portion of an inactive surface of the semiconductor die is exposed.

10. The semiconductor device of claim 9 further comprising:
    a heat sink attached to the portion of the inactive surface of the semiconductor die.

11. The semiconductor device of claim 7, wherein the grid array of external electrical contacts is a peripheral array.

12. A plastic land grid array semiconductor device comprising:
    a semiconductor die having a plurality of bonding pads on an active surface;
    a leadframe having a plurality of L-shaped leads, the plurality of L-shaped leads having a horizontal portion and a vertical portion, both portions having a thickness, wherein the horizontal portion extends over the active surface of the semiconductor die from an edge of the semiconductor die toward the plurality of bonding pads and the vertical portion is angled away from the semiconductor die;
    an anisotropic conductive adhesive coupling the plurality of bonding pads on the active surface of the semiconductor die and the horizontal portion of the plurality of leads of the leadframe to electrically connect the semiconductor die to the leadframe;
    a plastic package body covering at least the active surface of the semiconductor die, the anisotropic adhesive, and a portion of the plurality of leads, wherein the vertical portion of the plurality of leads terminates at a surface of the plastic package body, said surface being substantially parallel to the active surface of the semiconductor die; and
    an insulative coating on an external side portion of the plastic package body to cover any exposed thickness of the horizontal portion of the plurality of leads;
wherein the thickness of the vertical portion of the plurality of L-shaped leads is exposed on the surface of the plastic package body to form a grid array of external electrical contacts.

13. The semiconductor device of claim 13, wherein the grid array of external electrical contacts is an area array.

14. The semiconductor device of claim 13, wherein the vertical portion of the plurality of leads is angled away from the semiconductor die at substantially 90 degrees from the active surface of the semiconductor die.

15. The semiconductor device of claim 13, wherein a portion of an inactive surface of the semiconductor die is exposed and wherein a heat sink is attached to the portion of the inactive surface.

* * * * *